United States Patent [19]

Takada

[11] Patent Number: 4,691,224

[45] Date of Patent: Sep. 1, 1987

[54] PLANAR SEMICONDUCTOR DEVICE WITH DUAL CONDUCTIVITY INSULATING LAYERS OVER GUARD RINGS

[75] Inventor: Ikunori Takada, Amagasaki, Japan

[73] Assignee: Mitsubishi Denki Kabushiki Kaisha, Tokyo, Japan

[21] Appl. No.: 856,434

[22] Filed: Apr. 22, 1986

Related U.S. Application Data

[63] Continuation of Ser. No. 543,140, Oct. 18, 1983, abandoned.

[30] Foreign Application Priority Data

Oct. 25, 1982 [JP] Japan .................................. 57-188555

[51] Int. Cl.⁴ ............................................. H01L 29/40
[52] U.S. Cl. ......................................... 357/53; 357/52; 357/54; 357/59
[58] Field of Search ........................ 357/20, 52, 53, 54, 357/59

[56] References Cited

U.S. PATENT DOCUMENTS

| | | | |
|---|---|---|---|
| 3,601,668 | 8/1971 | Slaten et al. | 357/53 |
| 3,909,119 | 9/1975 | Wolley | 357/52 |
| 3,971,061 | 7/1976 | Matsushita et al. | 357/52 |
| 3,977,019 | 8/1976 | Matsushita et al. | 357/52 |
| 4,024,564 | 5/1977 | Shimada et al. | 357/53 |
| 4,060,827 | 11/1977 | Ono et al. | 357/52 |
| 4,080,619 | 3/1978 | Suzuki | 357/54 |
| 4,305,085 | 12/1981 | Jaecklin et al. | 357/52 |
| 4,412,242 | 10/1983 | Herman et al. | 357/52 |
| 4,468,686 | 8/1984 | Rosenthal | 357/53 |
| 4,485,393 | 11/1984 | Kumamaru et al. | 357/52 |
| 4,567,502 | 1/1986 | Nakagawa et al. | 357/53 |

FOREIGN PATENT DOCUMENTS

| | | | |
|---|---|---|---|
| 941074 | 1/1974 | Canada | 357/53 |
| 54-4229 | 3/1979 | Japan | 357/53 |
| 56-60055 | 5/1981 | Japan | 357/52 |

OTHER PUBLICATIONS

Keil et al.; Nuclear Instruments and Methods 104; No. 1; 1972; pp. 209–214.

Kao et al.; Proceedings of the IEEE; vol. 55; No. 8; Aug. 1967; pp. 1409–1414.

*Primary Examiner*—Joseph E. Clawson, Jr.
*Attorney, Agent, or Firm*—Birch, Stewart, Kolasch & Birch

[57] ABSTRACT

A planar semiconductor device having a main p-n junction surrounded by at least one guard ring covered with an insulating layer having an opening is provided with an electrode electrically connected to said guard ring through the opening. The said electrode is provided such that it does not extend beyond the end of the guard ring region which is located in an opposite side to the main p-n junction.

10 Claims, 13 Drawing Figures

PLANAR SEMICONDUCTOR DEVICE WITH DUAL CONDUCTIVITY INSULATING LAYERS OVER GUARD RINGS

This application is a continuation of application Ser. No. 543,140 filed on Oct. 18, 1983, and now abandoned.

FIELD OF THE INVENTION

The present invention relates to a planar semiconductor device having a p-n junction surrounded by at least one guard ring which allows the device to obtain a high reverse blocking voltage.

BACKGROUND OF THE INVENTION

It has been long considered that it is more difficult to obtain a high reverse blocking voltage in a planar semiconductor device than in a mesa semiconductor device. Accordingly, to increase the planar semiconductor device resistance to high voltage, many proposals have been made. One of these proposals is to provide a guard ring, and another is to provide a field plate. Recently a mold packaged voltage-resistant element has become popular because of its high breakdown resistance to a voltage of not smaller than 1,000 v. However, the most important thing is not that the element can withstand such a high voltage, but that it can be mass-procuced without losing its high breakdown resistance and reliability. In this respect the planar semiconductor device has been found to be basically superior to the mesa semiconductor device.

In general, the voltage breakdown resistance of semiconductor devices depends on how to evenly reduce the intensity of electric field at the junction where a high voltage is maintained. This idea is not only applicable to a planar semiconductor device but also to a mesa semiconductor device. In fact, by applying this idea to mesa semiconductor devices they have been found to withstand high voltages of 10,000 v or more. In this case, however, considerably elaborate construction is required for bevelling or coating with plastic in a bevelled part. In addition, bevelling is required in a relatively vast area around the chip. Such requirements make mass-production impossible or difficult to carry out. Furthermore, when mesa semiconductor devices are produced in this way, it has been found that they do not exhibit a sufficient reliability in a high temperature reverse bias blocking test conducted on a DC source of supply. Alternatively, the glassivation process, in which a powdered glass is sintered in grooves formed at the junctions, finds itself applicable for mass-production, and also effective to solve the problem of unstability involved in the plastic sealing. However, disadvantages have been also found; one is the insufficient dispersion of electric field at the junction resulting from the difficulty of forming side walls of the grooves at an inclination of more than 90° to the junction. Another is the localizing or partial intensifying of electric fields, which results from a requirement relating to the layers of high resistivity, requiring their thickness to be as thin as possible for transistors, or high quality diodes which is not applicable to an ordinary class of transistors, or diodes. However, as well known, a thin layer tends to cause the electric field to intensify. Accordingly, it is impractical when the voltages to be applied to is 1,000 v or more. Furthermore, no improvement has been found in high temperature DC reverse bias blocking ability.

In contrast, the planar semiconductor devices, in principle, allows a relatively large space for the electric fields. Accordingly, if the detrimental localizing of electric field is avoided, it is possible to construct such planar semiconductor devices which can constantly withstand high voltages. In fact, however, it is not easy to achieve this objective due to the likelihood that the electric fields will intensify partially around the junction between the silicon substrate and the silicon dioxides layer, wherein the degree of the intensifying of electric field varies with production factors. The guard rings or the field plates are effective to reduce the degree of the intensifying of electric field in this area. In addition, when this type of planar semiconductor devices are subjected to a high temperature reverse bias blocking test conducted on a DC source of supply, an inversion is likely to occur in the silicon surface due to a potential difference between the surface and the undersurface of the layers, whereby the reverse blocking voltage is stepped up. This shows that some cause or other inherently exists for enhancing the voltage breakdown resistance.

To exemplify the principle of this phenomenon, reference will be more particularly made to FIG. 1, in which FIG. 1 (a) shows a cross-section on an enlarged scale of part of a silicon chip, prior to a high temperature reverse bias blocking, and in which FIG. 1 (b) is a diagrammatic view showing potentials in the surface of the silicon chip. The reference numeral 1 designates an insulating layer, and the reference numeral 2 designates a depletion layer. The reference numeral 3 designates a channel stop (N+) region, and the reference numeral 4 designates a N− layer. The reference numeral 5 designates a P- layer, and the reference character J1 designates a p-n junction at which the N− layer 4 and the P- layer 5 meet. In FIG. 1 (b) the vertical axis represents the electric potentials, and the horizontal axis represents the distances on the surface from the p-n junction, which consists of the P- layer 5 and the N− layer 4. The curve A represents the potentials in the surface of the high resistivity region, that is, the N− layer 4 (the undersurface of the insulating layer) and the curve B represents potentials in the surface of the insulating layer 1. The potential in the surface of the insulating layer 1 depends on the electric conductivity of the bulk of the insulating layer 1, and that of the surface thereof. If the electric conductivity of the surface of the layer 1 is slightly higher than that of the bulk of this layer, a potential difference occurs between the surface and the undersurface of the layer due to a difference between the potential distribution in the surface of the insulating layer 1 and that in the depletion layer 2. This is likely to cause an inversion in the region of high resistivity. A condition at which the surface of the insulating layer becomes slightly electrically conductive rarely occurs when the silicon chip is canned at a dry atmosphere, but it is likely to happen if the chip is sealed in a gel-like substance. In this case the depletion layer tends to extend, and the reverse blocking voltage becomes higher. Eventually, it may reach a stage at which the electric potential in an area adjacent to the channel stop region in the neighborhood of the chip becomes high, and a yielding may arise in this area. This phenomenon more readily occurs when the resistivity of the high resistivity region becomes higher, or when a higher voltage is impressed for conducting the blocking test. This will be fatal to a planar semiconductor device having a plastic sealing which only allows reverse blocking voltages of 500 v or around.

FIG. 2 (*a*) and (*b*) show a cross-section on an enlarged scale of part of a silicon chip, and electric potentials in the surface of the chip, respectively. In FIG. 2 (*b*) the vertical axis represents the electric potentials, and the horizontal axis represents the distances on the surface from the p-n junction, which consists of the P-layer 5 and the N⁻ layer 4, wherein the curve A represents the potential in the surface of high resistivity region 4, and wherein the curve B represents the potentials in the surface of the insulating layer 1. The curve C represents the electric fields in the horizontal direction in the neighborhood of the surface of the high resistivity region. The area D in FIG. 2 (*a*) represents a region in which an inversion is caused due to a potential difference between the surface and the undersurface of the insulating layer.

Referring to FIG. 3 (*a*) and (*b*), we will describe how to prevent the occurrence of a yielding in an area adjacent to the channel stop region around the chip. As shown in FIG. 3 (a), the channel stop region 3 is provided with an electrode 6, which, as a result of blocking tests, has been found to exhibit satisfactory results on the voltage breakdown resistance. In FIG. 3 (*b*), the curve A represents the potentials in the surface of the high resistivity region 4, the curve B represents the potentials in the surface of the insulating layer 1, and the curve C reprsents the electric fields expected in the surface of the high resistivity region 4. The newly provided electrode 6 affects the distrbutions of the potentials and electric fields represented by the curves A, and C respectively whereby the inversion area D is shortened in length to thereby reduce the intensifying of the electric field around the channel stop region to a greater extent. It will be understood from this that in order to secure a high reliability in the planar semiconductor devices of a high-voltage breakdown resistance it is essential to control the electric potentials between the surface and the undersurface of the insulating layer on the surface of the element. As a practical version, however, at least one guard ring or where necessary, several guard rings 11*a*, 11*b* . . . are provided as shown in FIG. 4 (*a*). If the main junction J1 alone is employed with no guard ring as shown in FIG. 1 (*a*), FIG. 2 (*a*) and FIG. 3 (*a*), it will be impossible to obtain the desired values for voltage breakdown resistance. In FIG. 4 (*b*) the curve A represents the potentials in the surface of the high resistivity region 4, the curve B represents the potentials in the surface of the insulating layer 1, and the curve E represents the potential difference between the surface and the undersurface of the insulating layer 1, expressed by: $E = B - A$. The guard ring is originally intended to prevent the localizing of electric field in the surface, but it is additionally effective to reduce the difference in potential between the surface and the undersurface of the insulating layer 1, which will be appreciated from FIG. 4 (*b*). This secures the reliability, particularly in devices which have a voltage breakdown resistance of about 500 v.

This use of one or more guard rings is applicable to a conventional type of high-voltage resistible planar semiconductor device so as to reduce the difference in potential between the surface and the undersurface of the insulating layer. This secures the reliabilty of devices which have a voltage breakdown resistance of around 500 v. However, it is not applicable to devices which have a voltage breakdown resistance of higher than 1000 v, because of the unstable factors involved in sealing with plastic.

OBJECTS AND SUMMARY OF THE INVENTION

An object of the present invention is to provide a highly reliable planar semiconductor device capable of reducing potential differences between the surface and the undersurface of the insulating layer.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to one aspect of the present invention, there is provided a planar semiconductor device which comprises a main p-n junction surrounded by at least one guard ring, which is covered with an insulating layer having an opening, an electrode electrically connected to the guard ring through the opening, wherein the electrode is provided such that it does not extend beyond the end of the guard ring region which is located in an opposite side to the main p-n junction.

According to another aspect of the present invention, there is provided a planar semiconductor device comprising a semiconductor substrate of a first electrically conductive type, a semiconductor region of second electrically conductive type, which is provided in a main side of said semiconductor substrate such that they constitute a part of the active element as well as a p-n junction within said substrate, a guard ring region of the second electrically conductive type which is provided in a main side of said substrate so as to surround said semiconductor region with a space therefrom, said guard ring region constituting a p-n junction with said substrate wherein said p-n junction is extended to the main side of said substrate, an insulating layer formed on the main side of said substrate, and an electrode electrically connected to said guard ring region through an opening formed in said insulating layer, wherein said electrode is located on said insulating layer without extruding beyond that part of said p-n junction constituted by said substrate and said guard ring region which part is located in an opposite side to said semiconductor region.

DETAILED DESCRIPTION OF THE INVENTION

Figure 1:
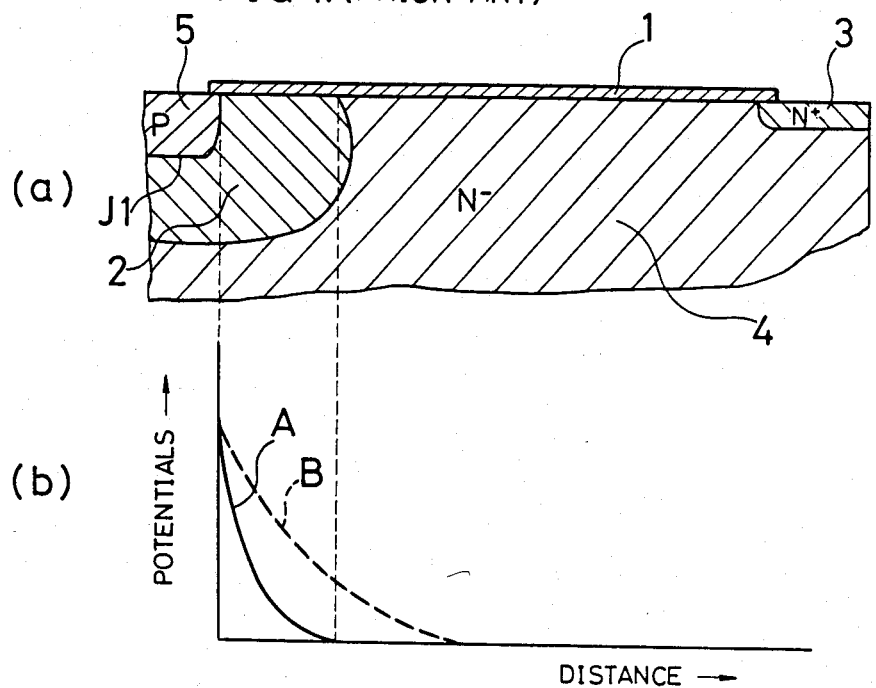
FIG. 1 (*a*) and (*b*) are diagrammatic views showing a prior art planar semiconductor device, wherein FIG. 1 (*a*) is a cross-section on an enlarged scale of part of a silicon chip, prior to a high temperature reverse bias blocking, and FIG. 1 (*b*) is a diagrammatic view showing electric potentials in the surface of the silicon chip.
Figure 2:
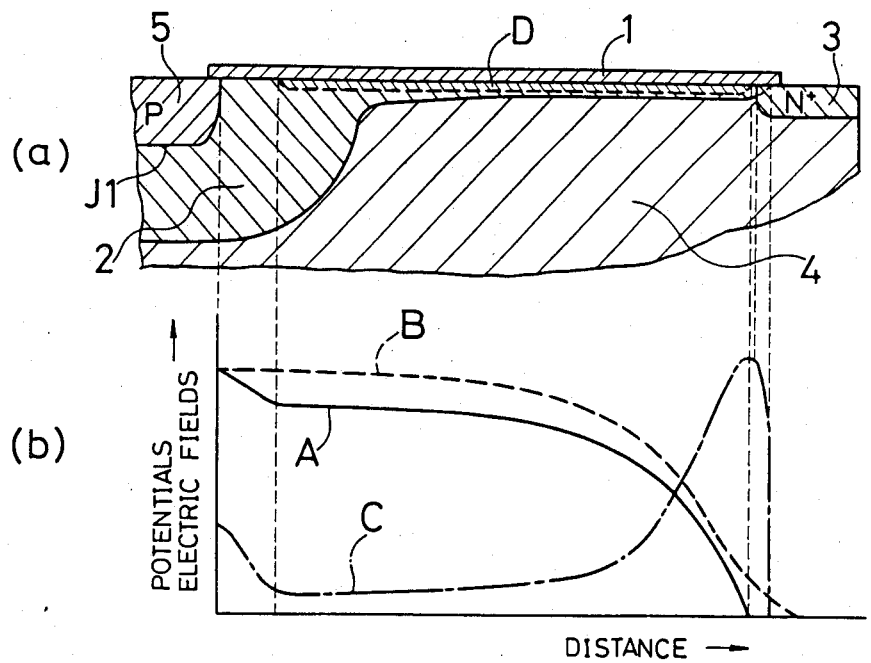
FIG. 2 (*a*) and (*b*) are diagrammatic view showing the silicon chip of FIG. 1 (*a*) put into operation, wherein FIG. 2 (*a*) is a cross-section on an enlarged scale of the silicon chip, and FIG. 2 (*b*) is a diagrammatic view showing electric potentials in the surface of the silicon chip.
Figure 3:
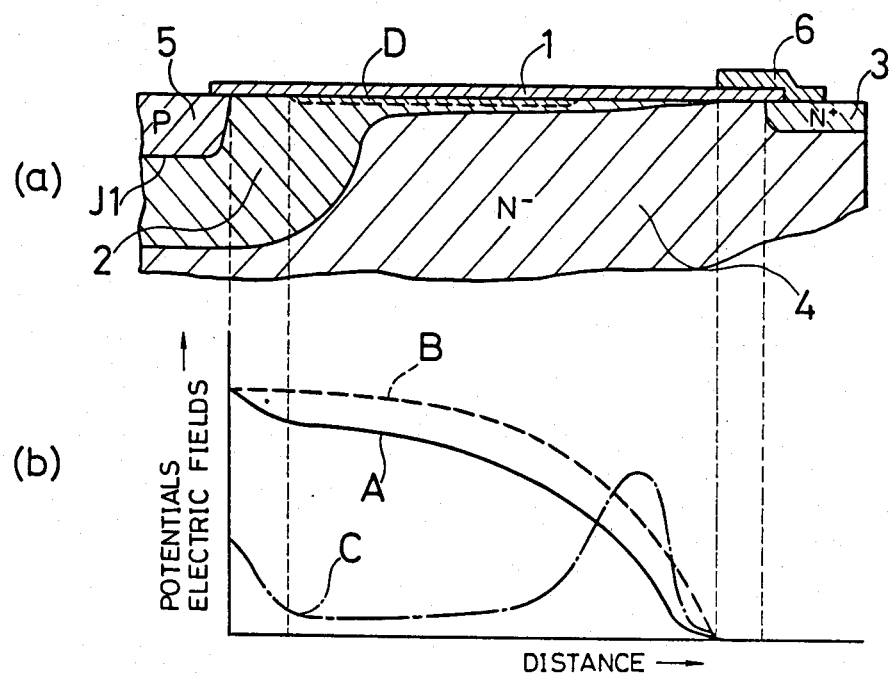
FIG. 3 (*a*) and (*b*) are diagrammatic views showing an improved prior art planar semiconductor device, wherein FIG. 3 (*a*) is a cross-section on an enlarged scale of part of the silicon chip, and FIG. 3 (*b*) is a diagrammatic view showing electric potentials in the surface of the silicon chip.
Figure 4:
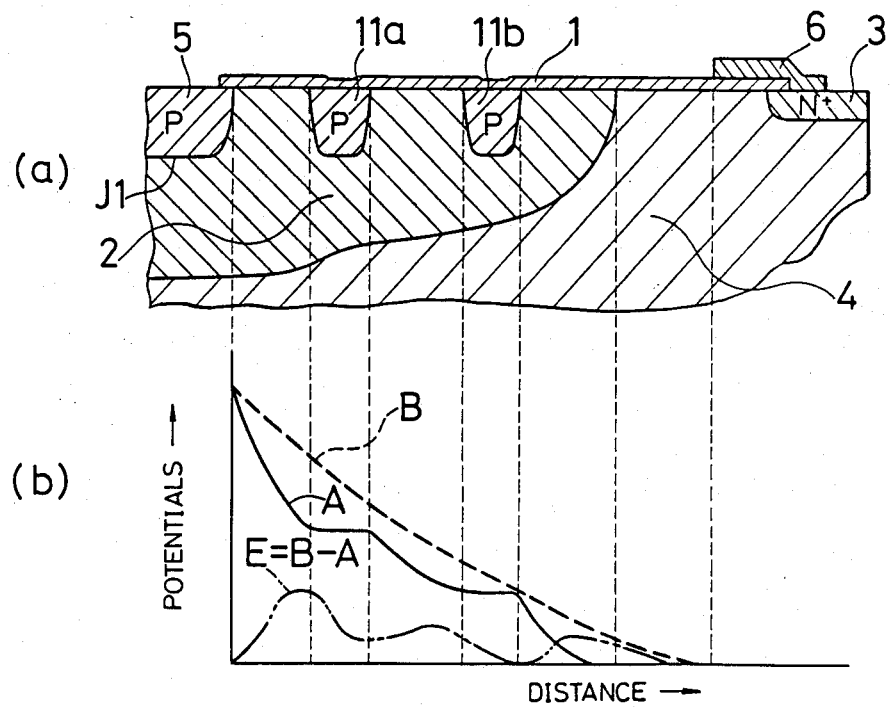
FIG. 4 (a) and (b) are diagrammatic views showing another improved prior art planar semiconductor device, wherein FIG. 4 (a) is a cross-section on an enlarged scale of part of the silicon chip, and FIG. 4 (b) is a diagrammatic view showing electric potentials in the surface of the silicon chip.

Referring now to the drawings where like reference numerals are used throughout FIGS. 1 to 8 to designate like parts and elements, no description will be repeated with respect to prior art planar semiconductor devices, which has been heretofore given to explain the background ground of the present invention.

Figure 5:
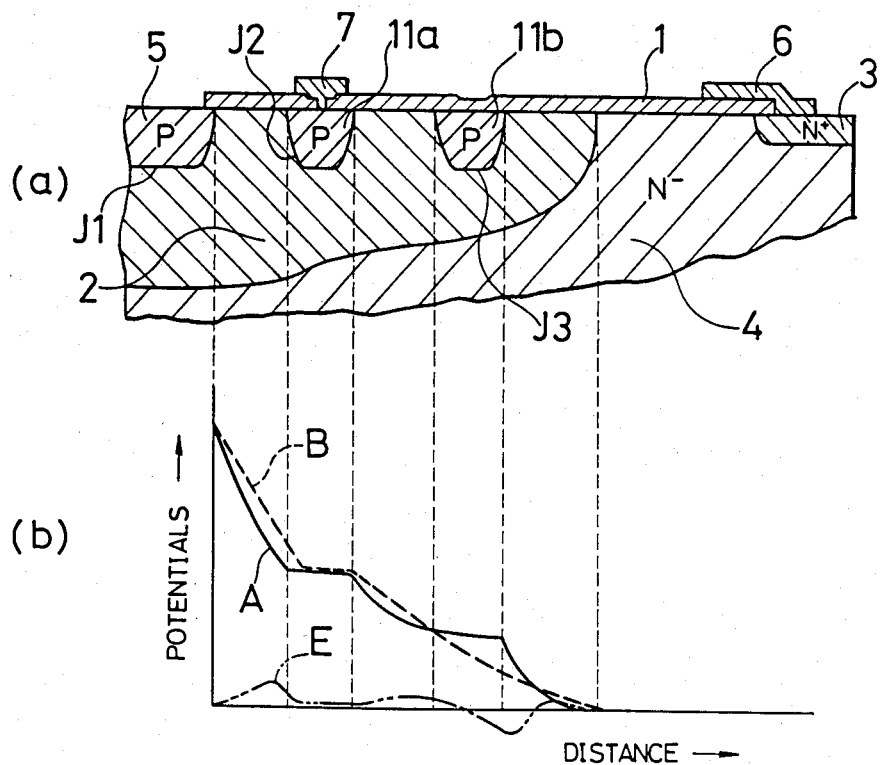
FIG. 5 (a) and (b) are diagrammatic views showing one embodiment according to the present invention, wherein FIG. 5 (a) is a cross-section on an enlarged scale of part of the silicon chip, and FIG. 5 (b) is a diagrammatic view showing electric potentials in the surface of the silicon chip.

Referring to FIG. 5 (a) and (b), the reference numeral 7 designates an electrode electrically connected to a guard ring 11a through an opening produced in an insulating layer 1 laid thereon, wherein it is arranged such that the electrode 7 does not extend outside the guard ring 11a. That is, the electrode 7 is arranged such that it does not extrude beyond that part of the p-n junction J2 constituted by the N$^-$ layer 4 and the guard ring region 11a which part is located in an opposite side to the P- layer 5. In FIG. 5 (b) the curve A represents the potentials in the surface of the high resistivity region, the curve B represents the potentials in the surface of the insulating layer 1, and the curve E represents the potential difference between the surface and the undersurface of the insulating layer, expressed by: $E = B - A$.

In this arrangement the potential in the surface of the silicon chip is effective to equalize the potential in the surface of the insulating layer 1 in the neighborhood of the guard ring 11a to that in the guard ring 11a, and also to stabilize and reduce the potential difference between the surface and the undersurface of the insulating layer 1. In addition, it behaves so as not to prolong the depletion layer 2.

Figure 6:
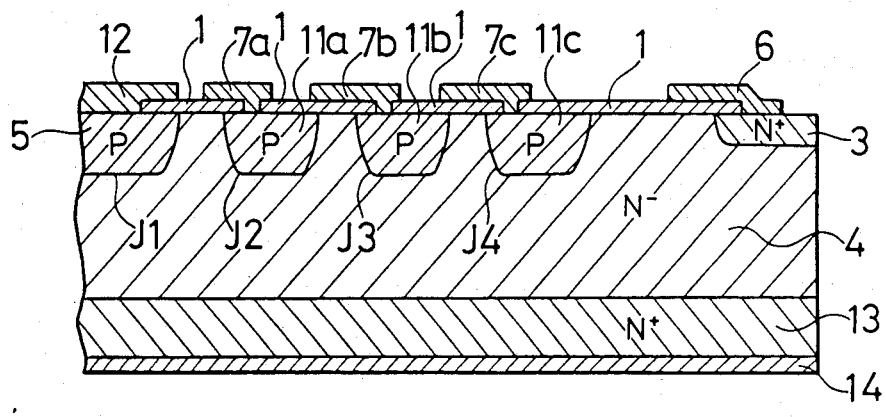
FIGS. 6, 7 and 8 are diagrammatic views showing various modifications of the present invention, each being a cross-section on an enlarged scale of part of the silicon chip.
Figure 7:
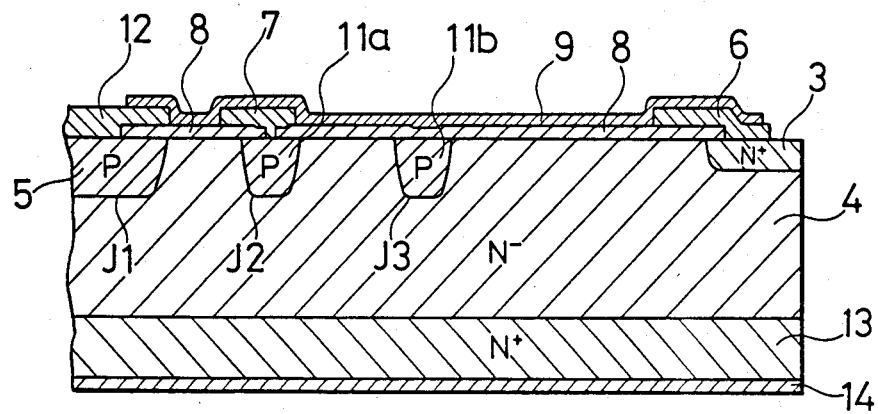

In the inner surface of the guard ring 11a a potential difference E occurs between the surface and the undersurface of the insulating layer 1 to some extent, which is likely to cause an inversion in the high resistivity region 4. In order to prevent this inversion, it is preferred to extend the electrode 7 inwardly, that is, toward the main p-n junction J1 which is constituted by the P- layer 5 and the N$^-$ layer 4. In other words, it is preferred to extend it beyond that part of the p-n junction J2 constituted by the N$^-$ layer 4 and the guard ring 11a which part is located toward the P- layer 5, and reach over the high resistivity region 4. To this end, it is preferable that if the size of the chip permits, several guard rings 11a, 11b, 11c ... are provided at small intervals, and that each guard ring is provided with an electrode 7a, 7b, 7c ..., each of which is inwardly, that is, toward the P- layer 5 extended, as shown in FIG. 6. The electrodes 7b and 7c are preferably provided such that each overrides the adjacent guard rings 11a, 11b respectively, thereby enhancing the reliability as semiconductor devices. The number of the guard rings is decided in accordance with the allowable space provided by the chip, and the characteristics of voltage-resistibility thereof. Because of the potential distribution in the depletion layer, the preferred arrangement mentioned above should be applied to the guard ring 11a located nearest to the main p-n junction J1, which consists of the P- layer 5 and the N$^-$ layer 4. In addition, care must be directed to the discharge likely to occur between both electrodes on the element, particularly between an electrode 12 connected to the P- layer 5 and the first electrode 7a, that is, the one located adjacent to the electrode 12. In this case, as shown in FIG. 7 it is possible to place a second insulating layer 9 on the previously laid insulating layer 8 and the electrode 7, wherein the second layer 9 can be made of a CVD film of silicon oxide or silicon nitride, or polyimide.

Figure 8:
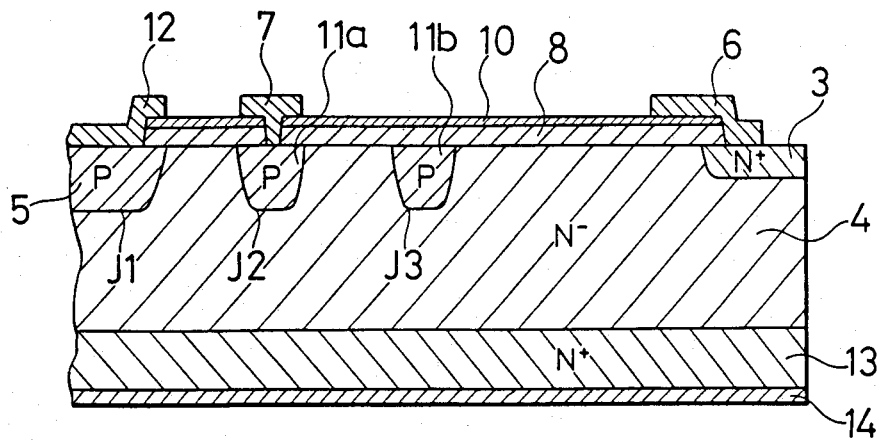

FIG. 8 shows an alternative embodiment in which two insulating layers are provided at least between the adjacent electrodes. More than two layers can be employed. It is arranged that the upper layer 10 is more electrically conductive than the lower layer 8. As a result, the potential in the surface of the insulating layer is stabilized by locating the electrode at an appropriate position, thereby increasing the reliability. Insulating layers of different conductivity can be made by differentiating the proportions of Si and $O_2$ if the layers comprising $SiO_2$ are made of a CVD film. In FIGS. 6 to 8 the reference numeral 13 designates an N$^+$ layer, which is made by introducing impurities of N-type into the opposite main side of the N$^-$ layer 4 so as to allow of easy electrical contact therewith. The reference numeral 14 designates an electrode kept in ohmic contact with the N$^+$ layer 13. The reference symbols J3, J4 designate p-n junctions constituted by the N$^-$ layer 4 and the guard rings 11b, 11c respectively.

In each of the embodiments referred to above, each guard ring is normally made as narrow in width as possible so long as its effective area is sufficient to maintain its high-voltage breakdown resistance. However, to increase the reliability, it is desirable to widen the guard ring region to some extent, because of the fact that as the guard ring region becomes wider, the potential difference E between the surface and the undersurface of the insulating layer tends to become smaller. In the embodiments mentioned above, the P-N$^-$ junction is employed, but of course it can be effectively changed to an N-P$^-$ junction.

As evident from the foregoing description, a planar semiconductor device of the invention reduces potential differences between the surface and the undersurface of the insulating layer, and also electrically stabilizes the surfaces of the high-voltage resistivity region without losing its high-voltage resistibility.

What is claimed is:

1. A planar semiconductor device comprising:
   a main p-n junction formed in a substrate of a first electrically conductive type;
   channel stop of said first electrically conductive type formed in said substrate;
   guard means disposed in a first region, which is disposed between said main p-n junction and said channel stop, and being at least partially covered with an insulation layer, said insulating layer extending over substantially the entirety of said first region, said guard means minimizing an electric potential difference that may exist between a side of said insulating layer confronting said substrate and a side of said insulating layer opposite to said side confronting said substrate throughout said first region;

said guard means including, a guard ring consisting essentially of a guard ring region composed of a second electrically conductive type extending to the surface of said substrate so as to be in contact with said insulating layer, said insulating layer having an opening above a portion of said guard ring, and an electrode electrically connected to said guard ring through said opening and at least partially covering said insulating layer, said electrode being otherwise electrically isolated, said electrode being provided such that it does not extend outside the said guard ring region in a direction away from said main p-n junction and wherein said insulating layer comprises two or more layers wherein the upper layer is more electrically conductive than the lower layer which has a surface disposed on said substrate.

2. A planar semiconductor device as defined in claim 1, wherein said electrode is provided such that it extends beyond the end of said guard ring region in the direction of said main p-n junction.

3. A planar semiconductor device comprising:
a semiconductor substrate of a first electrically conductive type;
a semiconductor region of a second electrically conductive type which is formed in a first side of said semiconductor substrate to form an active element p-n junction with said substrate;
a channel stop of a first electrically conductive type formed in the first side of said semiconductor substrate;
insulating layer formed atop said first side of said semiconductor substrate,
said insulating layer extending across a first region of said first side of said semiconductor substrate from said semiconductor region of a second electrically conductive type to said channel stop;
guard means for minimizing an electrical potential difference between a side of said insulating layer confronting said first side of said semiconductor substrate and a side of said insulating layer opposite to said side confronting said substrate across an entirety of said insulating layer;
said guard means including,
a guard ring region of the second electrically conductive type, which is provided in the first side of said substrate so as to surround said semiconductor region spaced apart therefrom, said guard ring region forming a p-n junction with said substrate which extends to the surface of the first side of said substrate, and
an electrode electrically connected to said guard ring region through the opening formed in said insulating layer, said electrode being located on said insulating layer and electrically connected thereto without extending beyond that portion of said p-n junction formed by said substrate and said guard ring region which is located on an opposite side of said region with respect to said semiconductor region, said electrode being otherwise electrically isolated, and
wherein said insulating layer comprises an upper insulating layer and a lower insulating layer wherein said upper insulating layer is more electrically conductive than said lower insulating layer disposed on said first side of said semiconductor substrate.

4. A planar semiconductor device as defined in claim 3, wherein said electrode extends beyond that portion of said p-n junction formed by said substrate and said guard ring region which is located between said guard ring region and said semiconductor region.

5. A planar semiconductor device as defined in claim 3, further comprising an additional guard ring region of said second electrically conductive type provided in the first side of said substrate so as to surround said first applied guard ring region spaced therefrom, said additional guard ring region forming a p-n junction with said substrate which extends to the surface of said first side of said substrate.

6. A planar semiconductor device comprising:
a semiconductor substrate
a main p-n junction formed in said substrate;
a guard ring formed in said substrate and encircling said main p-n junction;
an insulating layer having an upper surface and lower surface, said lower surface contacting a surface of said substrate and extending around said main p-n junction and said guard ring, said insulating layer being interrupted above said guard ring, said insulating layer includes a top insulating layer and a bottom insulating layer, said bottom insulating layer including said lower surface, said top insulating layer being more electrically conductive than said bottom insulating layer;
electrode means, electrically connected to said guard ring and extending onto the surface of said insulating layer, for reducing the voltage between the upper and lower surfaces of said insulating layer to reduce the voltage difference therebetween, said electrode means being a conductive electrode formed over the interruption in said insulating layer and extending beyond the periphery of said guard ring in the direction of said main p-n junction.

7. The planar semiconductor device of claim 6 further comprising a semiconductor channel stop formed in said semiconductor substrate and encircling the outer periphery of said planar semiconductor device including said guard ring.

8. The planar semiconductor device of claim 7 further comprising a channel stop electrode conductively connected to said channel stop and extending inwardly over said insulating layer towards said main p-n junction.

9. The planar semiconductor device of claim 7 having at least one additional guard ring with said insulating layer completely covering each additional guard ring.

10. A planar semiconductor device comprising:
a semiconductor substrate;
a main p-n junction formed in said substrate;
a guard ring formed in said substrate and encircling said main p-n junction;
an insulating layer including a top insulating layer and a bottom insulating layer wherein said top insulating layer is more electrically conductive than said bottom insulating layer, said insulating layer having an upper surface and a lower surface, said lower surface contacting a surface of said substrate, and extending around said main p-n junction and said guard ring, said insulating layer being interrupted above said guard ring;

electrode means, electrically interconnection said guard ring and said upper surface of said insulating layer, for reducing the voltage between the upper and lower surfaces of said insulating layer, said electrode means being a conductive electrode otherwise electrically isolated.

* * * * *